(12) United States Patent
Nishiyama et al.

(10) Patent No.: US 8,274,141 B2
(45) Date of Patent: Sep. 25, 2012

(54) SEMICONDUCTOR MEMORY CARD AND SEMICONDUCTOR MEMORY DEVICE

(75) Inventors: Taku Nishiyama, Yokohama (JP); Tetsuya Yamamoto, Yokohama (JP); Naohisa Okumura, Yokohama (JP); Takuya Futatsuyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 635 days.

(21) Appl. No.: 12/400,390

(22) Filed: Mar. 9, 2009

(65) Prior Publication Data

US 2009/0236722 A1    Sep. 24, 2009

(30) Foreign Application Priority Data

Mar. 21, 2008 (JP) ................ P2008-073165
Dec. 11, 2008 (JP) ................ P2008-315489

(51) Int. Cl.
  *H01L 23/02* (2006.01)
(52) U.S. Cl. .......... 257/686; 257/777; 257/E23.01
(58) Field of Classification Search ............ 257/686, 257/723, 690, E23.003, E23.01
  See application file for complete search history.

(56) References Cited

U.S. PATENT DOCUMENTS

| | | | | |
|---|---|---|---|---|
| 4,942,453 A | * | 7/1990 | Ishida et al. | 257/692 |
| 5,287,000 A | * | 2/1994 | Takahashi et al. | 257/676 |
| 7,348,668 B2 | | 3/2008 | Masuda et al. | |
| 2006/0261489 A1 | * | 11/2006 | Takemoto et al. | 257/774 |
| 2007/0002509 A1 | * | 1/2007 | Kumagai et al. | 361/56 |
| 2007/0035002 A1 | * | 2/2007 | Moto et al. | 257/686 |
| 2007/0130414 A1 | * | 6/2007 | Ni et al. | 711/103 |
| 2007/0228509 A1 | | 10/2007 | Okada et al. | |
| 2009/0230534 A1 | * | 9/2009 | Okada | 257/686 |

FOREIGN PATENT DOCUMENTS

| | | |
|---|---|---|
| JP | 2005-302871 | 10/2005 |
| JP | 2007-293800 | 11/2007 |

OTHER PUBLICATIONS

U.S. Appl. No. 12/558,814, filed Sep. 14, 2009, Nishiyama, et al.

\* cited by examiner

*Primary Examiner* — Wael Fahmy
*Assistant Examiner* — Sarah Salerno
(74) *Attorney, Agent, or Firm* — Oblon, Spivak, McClelland, Maier & Neustadt, L.L.P.

(57) ABSTRACT

A semiconductor memory card includes a wiring board having an outer shape where a cut-out portion is provided at a first long-edge. A second surface of the wiring board includes connection pads disposed along a portion except the cut-out portion of the first long-edge. A memory device is mounted on the second surface of the wiring board. The memory device includes electrode pads arranged along a long-edge positioning in a vicinity of the first long-edge of the wiring board, and one-sidedly disposed so as to correspond to disposed positions of the connection pads. A controller device is stacked on the memory device.

16 Claims, 5 Drawing Sheets

SEMICONDUCTOR MEMORY CARD AND SEMICONDUCTOR MEMORY DEVICE

CROSS-REFERENCE TO RELATED APPLICATIONS

This application is based upon and claims the benefit of priority from the prior Japanese Patent Application No. 2008-073165, filed on Mar. 21, 2008 and Japanese Patent Application No. 2008-315489, filed on Dec. 11, 2008; the entire contents of which are incorporated herein by reference.

BACKGROUND OF THE INVENTION

Attempts to make a memory card (semiconductor memory card) housing a nonvolatile semiconductor memory device such as an NAND-type flash memory small in size and high-capacity have been advanced rapidly. Semiconductor devices (semiconductor chips) such as a memory device and a controller device are stacked to be mounted on a wiring board to provide a downsized memory card. Further, there are many cases when memory devices in themselves are stacked in multistage on the wiring board. Electrode pads of the semiconductor device are electrically connected to connection pads of the wiring board via metal wires (bonding wires) by applying wire bonding.

Attempts to make the memory device in itself high-density, high-function, and high-capacity based on the high-density and high-function are advanced in addition to an improvement of a mounting structure of the memory device and the controller device on the wiring board to make the memory card high-capacity. An outer shape of the memory device tends to increase in size to enable the high capacity thereof. Meanwhile, an outer size of the memory device is defined by an SD™ standard and soon. A cut-out portion indicating directions of front-and-rear, obverse-and-reverse of the card when it is attached to a card slot is provided at an outer periphery of the memory card (refer to JP-A 2007-293800 (KOKAI)).

When the large-sized memory device is mounted on the wiring board for the memory card, there is a case when the connection between the wiring board and the memory card becomes difficult. This becomes a factor to restrict a size of the memory device which can be mounted on the wiring board. There is a case when the connection between the wiring board and the memory device cannot be secured, if a large memory device is mounted inside an effective area of the wiring board having the cut-out portion provided at a long-edge thereof. If the electrode pads are disposed along the long-edge of the memory device, all of the connection pads cannot be disposed because the cut-out portion of the wiring board becomes an obstacle.

When the memory devices are stacked on the wiring board in multistage, it is studied to stack the plural memory devices in step-wise to perform the wire bonding for the memory devices (refer to JP-A 2005-302871(KOKAI). When the memory devices having the electrode pads arranged along short-edges are stacked in step-wise, a length in a step direction increases as the number of stacked layers increases, and an occupied area of the memory devices relative to the wiring board increases. The size of the memory device is also restricted by the increase of the occupied area of the memory devices. There is a possibility that a memory device having a single short-edge pad structure is not able to correspond to an increase in the number of electrodes resulting from the high-density and high-function.

Further, there is a possibility that a chip size (in particular, a length in the short-edge direction) is not able to satisfy the standard of the memory card such as, for example, a micro SD™ card, in accordance with the high capacity as for the memory device in itself. The memory device generally has a structure in which plural (for example, two pieces of) memory array areas are disposed in parallel, and peripheral circuits are disposed at the same area and in the same direction as a pad column. According to the circuit disposition as stated above, there is a possibility that the standard of the memory card cannot be satisfied because it is difficult to decrease the length in the short-edge direction of the memory device.

SUMMARY OF THE INVENTION

A semiconductor memory card according to a first aspect of the present invention, includes: a wiring board having an outer shape in rectangular state including a cut-out portion provided at a first long-edge, a first surface including an external connection terminal, and a second surface including connection pads disposed along a portion except the cut-out portion of the first long-edge; a memory device, mounted on the second surface of the wiring board, including electrode pads one-sidedly arranged to correspond to disposed positions of the connection pads, along a long-edge positioning in a vicinity of the first long-edge of the wiring board; a controller device, stacked on the memory device, including electrode pads arranged along at least one outer edge; first metal wires electrically connecting the electrode pads of the memory device and the connection pads of the wiring board; second metal wires electrically connecting the electrode pads of the controller device and the connection pads of the wiring board; and a sealing resin layer formed on the second surface of the wiring board to seal the memory device and the controller device together with the first and the second metal wires.

A semiconductor memory card according to a second aspect of the present invention, includes: a wiring board having an outer shape in rectangular state including a cut-out portion provided at a first long-edge, a first surface including an external connection terminal, and a second surface including connection pads disposed along a portion except the cut-out portion of the first long-edge; a memory device group having a plurality of memory devices stacked on the second surface of the wiring board, the memory devices including electrode pads one-sidedly arranged to correspond to disposed positions of the connection pads along a long-edge positioning in a vicinity of the first long-edge of the wiring board; a controller device, stacked on the memory device group, including electrode pads arranged along at least one outer edge; first metal wires electrically connecting the electrode pads of the memory devices and the connection pads of the wiring board; second metal wires electrically connecting the electrode pads of the controller device and the connection pads of the wiring board; and a sealing resin layer formed on the second surface of the wiring board to seal the memory device group and the controller device together with the first and the second metal wires.

A semiconductor memory device according to another aspect of the present invention, includes: a plurality of cell array areas having rectangular area shapes, and disposed in parallel while aligning directions of long-edges of the area shapes; a first peripheral circuit area, disposed between the plurality of cell array areas, including a voltage pump circuit; and a second peripheral circuit area, disposed at one short-edge side of the plurality of cell array areas, having electrode pads arranged along a direction of the short-edges.

DETAILED DESCRIPTION OF THE EMBODIMENTS

Hereinafter, embodiments of the present invention are described with reference to the drawings.

Figure 1:
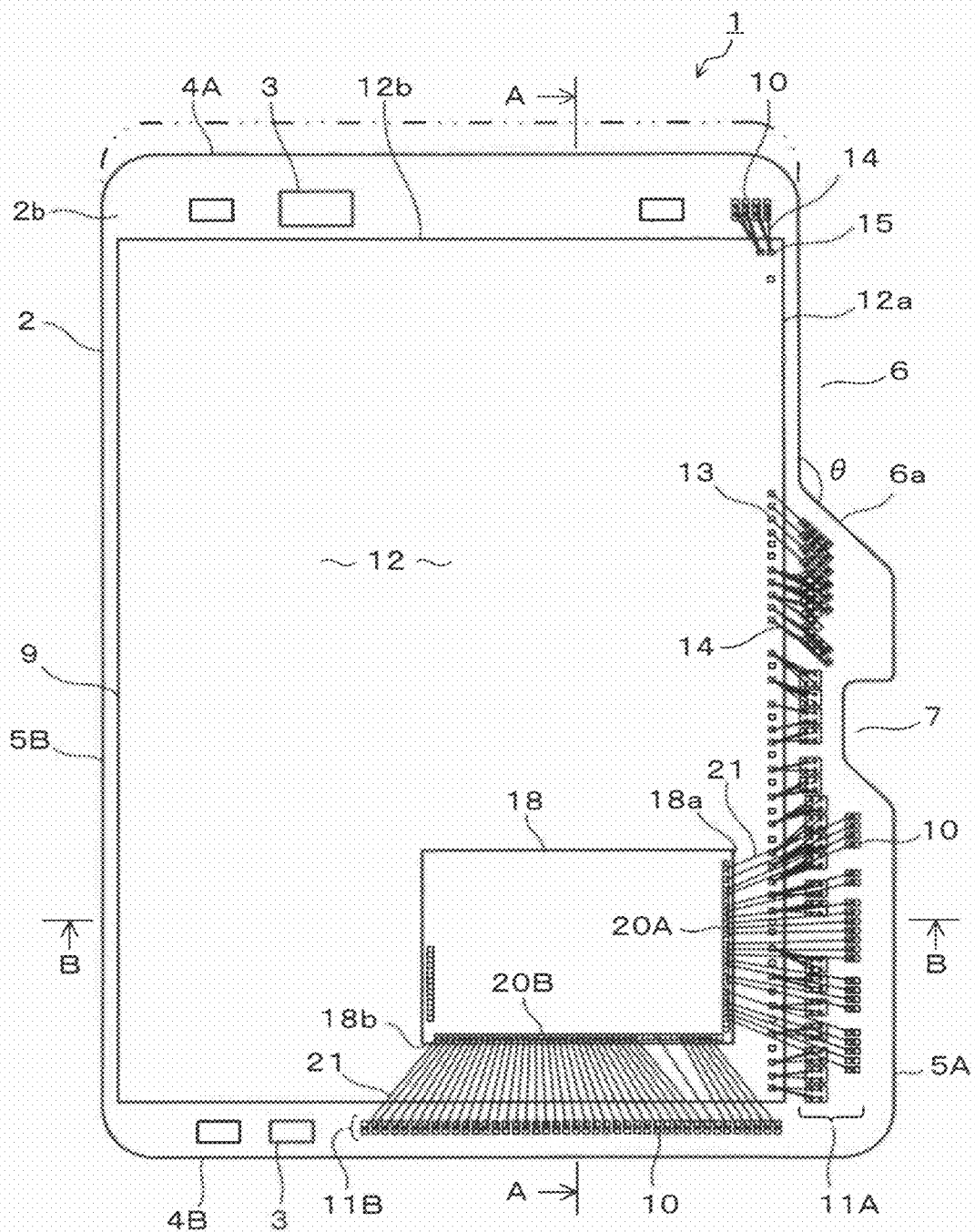
FIG. 1 is a plan view showing a semiconductor memory card according to an embodiment of the present invention.
Figure 2:
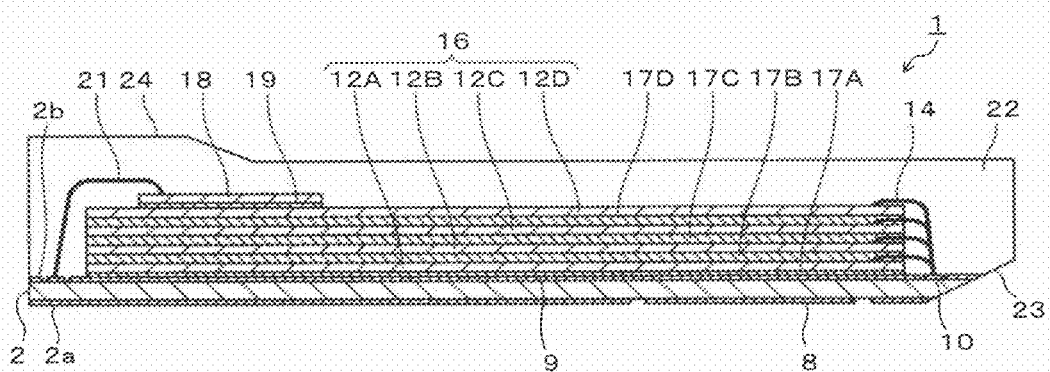
FIG. 2 is a sectional view taken along the line A-A in FIG. 1.
Figure 3:
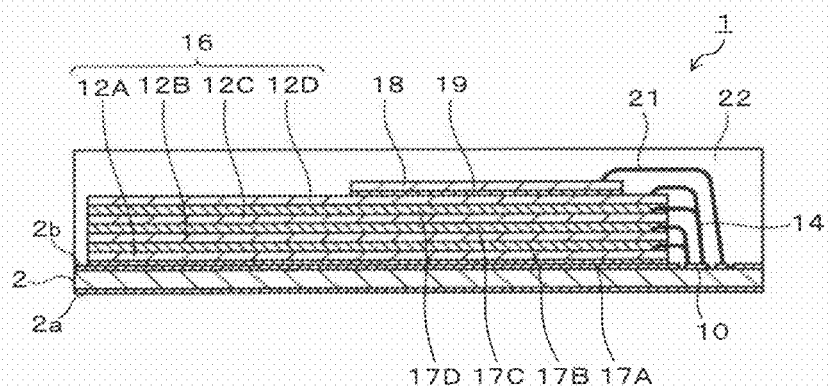
FIG. 3 is a sectional view taken along the line B-B in FIG. 1.

FIG. 1, FIG. 2, and FIG. 3 show a semiconductor memory card according to an embodiment of the present invention. FIG. 1 is a plan view of the semiconductor memory card. FIG. 2 is a sectional view taken along the line A-A in FIG. 1 (a sectional view cut in a long-edge direction). FIG. 3 is a sectional view taken along the line B-B in FIG. 1 (a sectional view cut in a short-edge direction). A semiconductor memory card 1 shown in these drawings is the one used as, for example, a memory card in a micro SD™ standard (micro SD™ card).

The memory card 1 includes a wiring board 2 serves as both a mounting substrate of semiconductor chips and a forming substrate of an external connection terminal. The wiring board 2 is the one, for example, a wiring network is provided inside or at a surface of an insulating resin substrate, and specifically, a print wiring board using a glass-epoxy resin, a BT resin (Bsmaleimide-Triazine resin), and so on are applied. The wiring board 2 has a first surface 2a to be a terminal forming surface and a second surface 2b to be a chip mounting surface. Electronic components (chip components) 3 such as a chip capacitor and a fuse are packaged on the second surface 2b of the wiring board 2.

The wiring board 2 has an approximately rectangular outer shape. A first short-edge 4A among edges constituting the outer shape of the wiring board 2 corresponds to a tip portion when the memory card 1 is inserted into a card slot. A second short-edge 4B corresponds to a rear portion of the memory card 1. A cut-out portion 6 and a constricted portion 7 are provided at a first long-edge 5A of the wiring board 2 so as to indicate directions of front-and-rear and obverse-and-reverse of the memory card 1. The cut-out portion 6 is provided from a corner portion between the first short-edge 4A and the first long-edge 5A (a virtual corner portion when the first short-edge 4A and the first long-edge 5A are extended) along the first long-edge 5A so that a width of the first short-edge 4A is narrower than a width of the second short-edge 4B. Incidentally, a shape of the cut-out portion 6 is not limited in particular, but it may be the one cutting out a part of the first long-edge 5A.

The cut-out portion 6 is provided at the wiring board 2 by cutting-out a part of the first long-edge 5A including the corner portion (virtual corner portion) between the first long-edge 5A and the first short-edge 4A. An end portion 6a of the cut-out portion 6 is inclined such that an angle θ becomes an obtuse angle. Further, the wiring board 2 has the constricted portion 7 where a part of the first long-edge 5A is cut out to be constricted in an approximately trapezoid state. Corner portions of the wiring board 2 are in curved states (R-shapes). The electronic components 3 are disposed at both short-edges 4A, 4B sides of the wiring board 2. A handle portion is provided at the short-edge 4B side of the wiring board 2, and a sealing resin thickness thereof becomes thick. Accordingly, it is effective as a packing area of the electronic components 3.

The approximately rectangular outer shape of the wiring board 2 is left-right asymmetry because of the cut-out portion 6 provided at the first long-edge 5A. Accordingly, an effective area to mount memory devices (semiconductor chips) in rectangular state is a rectangular area except a residual portion corresponding to a width of the cut-out portion 6 (an area having a width based on the width of the cut-out portion 6 and a length based on a portion except the cut-out portion 6 of the first long-edge 5A) from all over the area of the wiring board 2. A mounting area of the semiconductor chips (memory device and controller device) on the wiring board 2 is set at a rectangular area having a width based on a portion except the cut-out portion 6 of the first short-edge 4A and a length based on the first long-edge 5A. As for the two short-edges 4A, 4B sides of the wiring board 2, the mounting area is an area except the packing area of the electronic components 3.

An external connection terminal 8 to be an input/output terminal of the memory card 1 is formed on the first surface 2a of the wiring board 2. The external connection terminal 8 is composed of a metal layer formed by an electrolytic plating and so on. The first surface 2a of the wiring board 2 corresponds to a front surface of the memory card 1. Further, a first wiring network (not shown) is provided on the first surface 2a of the wiring board 2 except the forming area of the external connection terminal 8. The first wiring network has, for example, a test pad of the memory card 1. The first wiring network provided on the first surface 2a is covered with an insulating layer (not shown) using an insulating adhesive seal, adhesive tape, and so on.

The second surface 2b of the wiring board 2 includes a second wiring network including a chip mounting area 9 and connection pads 10. The second surface 2b of the wiring board 2 corresponds to a rear surface of the memory card 1. It is possible to make an effective mounting area of the rectangular state memory devices maximum by setting the chip mounting area 9 at a rectangular area except the residual portion corresponding to the width of the cut-out portion 6 from all over the area of the wiring board 2 at the wiring board 2 having the cut-out portion 6.

The second wiring network having the connection pads 10 is electrically connected to the external connection terminal 8 and the first wiring network via not-shown internal wirings (through holes and so on) of the wiring board 2. The connection pads 10 are each disposed at a first pad area 11A along the first long-edge 5A and at a second pad area 11B along the second short-edge 4B. The first pad area 11A is provided at the residual portion corresponding to the width of the cut-out portion 6 so as to enable an expansion of the effective area of the chip mounting area 9. In other words, the connection pads 10 at the first pad area 11A are disposed along the portion except the cut-out portion 6 of the first long-edge 5A.

Plural memory devices 12 are sequentially stacked to be mounted at the chip mounting area 9 of the wiring board 2. A semiconductor memory device (semiconductor chip) such as an NAND-type flash memory is used as the memory device 12. The plural memory devices 12 have identical shapes in rectangular states, and each include electrode pads 13. The electrode pads 13 are disposed at a long-edge 12*a* side positioning in a vicinity of the first long-edge 5A of the wiring board 2. However, the first pad area 11A along the first long-edge 5A is provided at the residual portion except the cut-out portion 6, and therefore, the electrode pads 13 are one-sidedly arranged so as to correspond to the first pad area 11A.

The electrode pads 13 of the memory device 12 are one-sidedly arranged along the long-edge 12*a*, and to correspond to disposed positions of the connection pads 10 inside the first pad area 11A. The electrode pads are not basically disposed at the portion positioning in a vicinity of the cut-out portion 6 at the area along the long-edge 12*a* of the memory device 12, but the electrode pads 13 are unevenly distributed at the portion corresponding to the first pad area 11A (the portion positioning in the vicinity of the first pad area 11A). The memory device 12 has a single long-edge pad structure in an unevenly distributed type. The electrode pads 13 of the memory device 12 are electrically connected to the connection pads 10 of the wiring board 2 via metal wires 14.

As stated above, it is possible to secure the connection between the connection pads 10 disposed inside the first pad area 11A which is effective to expand the area of the chip mounting area 9, and the electrode pads 13 of the memory device 12 by unevenly distributing the electrode pads 13 of the memory devices 12. In other words, it is possible to connect the electrode pads 13 arranged along the long-edge 12*a* of the memory device 12 and the connection pads 10 inside the first pad area 11A with the metal wires 14 in addition to mounting the large-sized memory device 12 on the chip mounting area 9. Accordingly, it is possible to secure the connection between the wiring board 2 and the memory device 12 in addition to mounting the memory device 12 as large as possible relative to the effective area of the wiring board 2 capable of mounting the semiconductor chips.

For example, a length of a short-edge (the second short-edge 4B) is 11 mm, a length of a long-edge (the second long-edge 5B) is 15 mm, a width of the cut-out portion 6 (the width parallel to the short-edge 4A) is 1.3 mm, a length (the length parallel to the long-edge 5B) is 6.4 mm, and the angle θ is 135° in the wiring board 2, according to a standard of the micro SD™ card. Accordingly, a size of the area capable of mounting the memory device 12 is 9.7 mm×15 mm. Incidentally, the areas to pack the electronic components 3 are necessary at the short-edges 4A, 4B sides of the wiring board 2, and a gap of approximately 0.2 mm is required between the outer shape of the wiring board 2 and the memory device 12. In consideration of the above, the maximum size of the chip mounting area 9 of the wiring board 2 is approximately 9.3 mm×13 mm.

A size of the first pad area 11A which is parallel to the first long-edge 5A of the wiring board 2 is 1.3 mm×8.6 mm when an inclined area (an end portion area of the residual portion corresponding to the width of the cut-out portion 6) resulting from the inclined end portion 6*a* of the cut-out portion 6 is excluded. The size of the first pad area 11A becomes a little larger than 1.3 mm×8.6 mm because the inclined area can be used as a pad area. The inclined area and the connection pads 10 existing at the area are disposed along the angle θ of the inclined end portion 6*a* of the cut-out portion 6 so as to use the inclined area as the pad area.

The memory device 12 with the same size (9.3 mm×13 mm) is mounted on the chip mounting area 9 of the wiring board 2. The connection pads 10 which are necessary for the connection with the memory device 12 are disposed at the first pad area 11A. The first pad area 11A is one-sided at the short-edge 4B side, and therefore, it is impossible to perform the wire bonding between all of the connection pads 10 and electrode pads 13 if the electrode pads 13 are evenly disposed at the long-edge 12*a* of the memory device 12. The electrode pads 13 of the memory device 12 are unevenly distributed with correspond to the first pad area 11A so as to address to the above-stated problem. It is possible to connect all of the connection pads 10 and electrode pads 13 via the metal wires 14.

In the memory card 1 according to the present embodiment, it is possible to finely connect the connection pads 10 of the wiring board 2 and the electrode pads 13 of the memory device 12 via the metal wires 14 in addition to mounting the large-sized memory device 12 at the chip mounting area 9 of the wiring board 2. Accordingly, it becomes possible to mount the memory device 12 which is increased in chip-size to make it high-capacity on the memory card 1 of which outer size is defined. Namely, it is possible to provide the high-capacity and practical memory card 1. For example, it is possible to provide an 8 GB micro SD™ card (the semiconductor memory card 1) by using four pieces of memory devices 12 enabling a storage capacity of 2 GB owing to improvement in recording density, increase in chip-size, and so on.

There is a case when a bad influence is exerted on operational characteristics of the memory device 12 when the unevenly distributed type single long-edge pad structure is applied for the memory device 12, because a power supply terminal and so on are also one-sidedly formed. In such a case, a power supply and electrode pads 15 for ground may be disposed at a corner portion of the memory device 12 as shown in FIG. 1. In FIG. 1, the electrode pads 15 are disposed at one corner portion of a short-edge 12*b* of the memory device 12. Only the connection pads 10 corresponding to the electrode pads 15 are disposed at the short-edge 4A side of the wiring board 2. In FIG. 1, a part of the electrode pads addressing for the unevenly distributed type pad structure are provided at the long-edge 12*a* side, and these electrode pads are made to be the electrode pads 15 by routing around toward the short-edge 12*b* side by an internal wiring. Accordingly, it is possible to address for the pad area at the long-edge 12*a* side.

Figure 4:
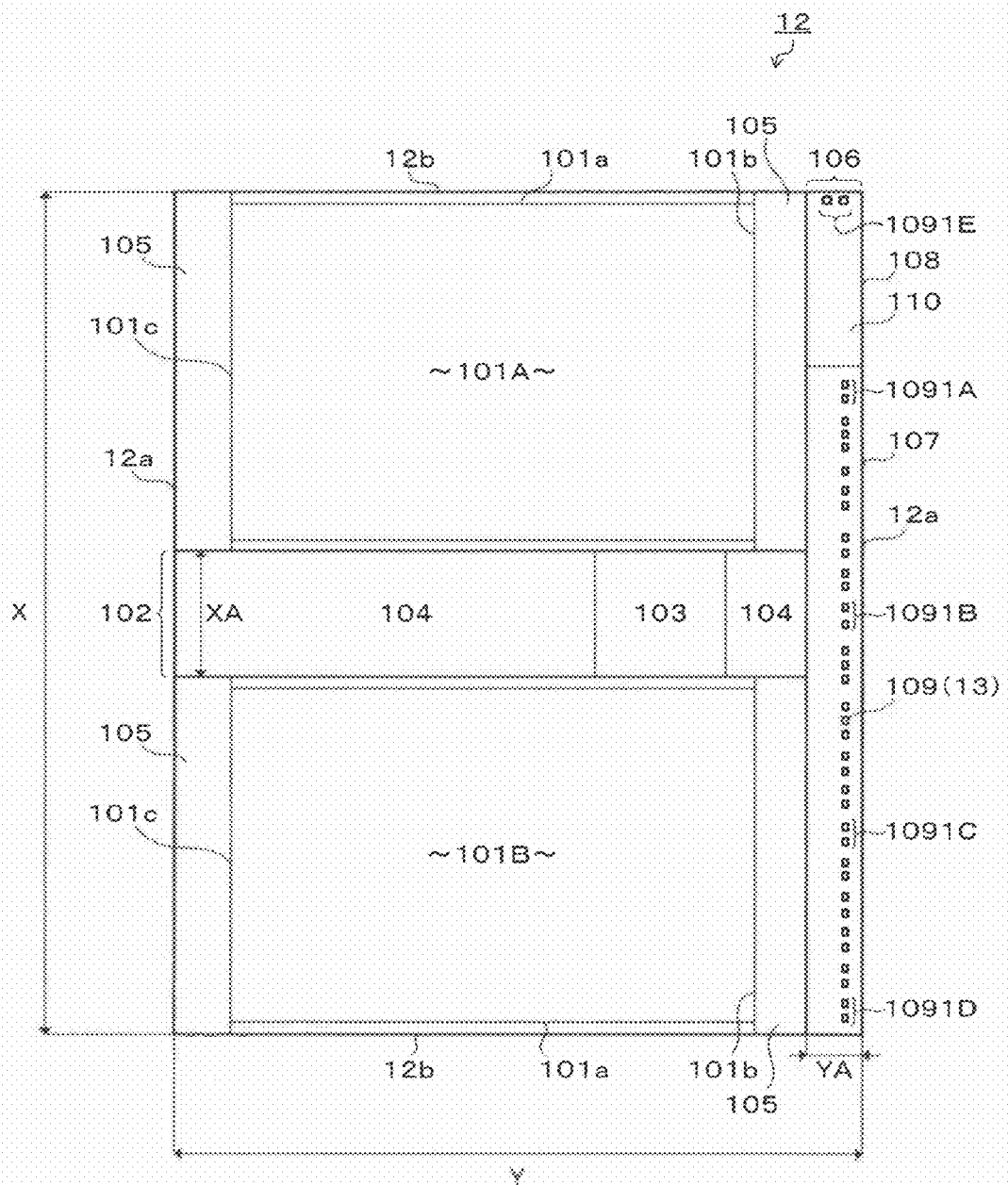
FIG. 4 is a plan view showing a constitution of a semiconductor memory device according to the embodiment of the present invention.

In the memory card 1 according to the embodiment, the memory device (the nonvolatile semiconductor memory device) 12 such as the NAND type flash memory has high capacity based on the high density, high function of its memory cell, and so on. Further, it has a circuit disposition satisfying the standard of, for example, the micro SD™ card in its device size (chip size). Namely, the memory device 12 of the embodiment includes the circuit disposition as shown in FIG. 4. It is enabled that, in particular, a length Y of the short-edge 12*b* of the rectangular memory device 12 satisfies the standard of a small-sized memory card such as the micro SD™ card based on the circuit disposition as stated above.

The memory device 12 includes plural cell array areas (planes of cell arrays) 101A, 101B having rectangular area shapes. The plural cell array areas 101A, 101B are disposed in parallel while aligning directions of long-edges (long-edge in a rectangular area shape) 101*a*. Each of the cell array areas 101A, 101B has plural pieces of memory cells disposed in a matrix state. The memory device 12 including two pieces of cell array areas 101A, 101B is shown, but the number of cell array areas 101 is not limited to two pieces. The memory device 12 may be the one having plural pieces of cell array areas 101.

A first peripheral circuit area 102 is disposed between the plural (two pieces) cell array areas 101A, 101B. The first peripheral circuit area 102 has a rectangular shape in which a long-edge is parallel to the short-edge 12b of the memory device 12 and a short-edge thereof is parallel to the long-edge 12a of the memory device 12. A voltage pump circuit 103 and peripheral circuits 104 including a word line control circuit of the memory cell and so on are provided in the first peripheral circuit area 102.

The voltage pump circuit 103 generates and controls programming voltage, read voltage and erase voltage of the NAND type flash memory cell from and so on from a power supply voltage (for example, 3V), which are applied to the NAND type flash memory cell and so on in the cell array areas 101A, 101B. A main voltage pump circuit of which voltage is the highest among the pump circuits and a pump circuit generating a voltage to be supplied to a non-selected word line at a read or write operation time is disposed at the voltage pump circuit 103. Incidentally, bit line control circuits 105 of the memory cells are provided along both short-edges 101b, 101c of the cell array areas 101A, 101B.

Further, a second peripheral circuit area 106 is disposed at one short-edge 101b side of the plural cell array areas 101A, 101B. The second peripheral circuit area 106 has a long rectangular shape in which a long-edge thereof is parallel to the long-edge 12a of the memory device 12 and a short-edge thereof is parallel to the short-edge 12b of the memory device 12. The second peripheral circuit area 106 has a pad area 107 and a circuit area 108. Electrode pads 109 (13) are arranged along the short-edges 101b of the cell array areas 101A, 101B at the pad area 107.

In the second peripheral circuit area 106, the pad area 107 is one-sidedly disposed at one short-edge 12b side of the memory device 12. Accordingly, the electrode pads 109 are unevenly distributed at one short-edge 12b side of the memory device 12 inside the second peripheral circuit area 106. Peripheral circuits 110 including a sub pump circuit are provided at the circuit area 108. A major part of control circuits necessary for the operation of the memory device 12 is provided inside the first peripheral circuit area 102 as the peripheral circuits 104. The minimum peripheral circuits 110 are provided at the second peripheral circuit area 106.

The electrode pads 109 have plural power supply pads (Vss and Vcc) 1091A to 1091D. Further, a power supply pad 1091E is provided at the circuit area 108 inside the second peripheral circuit area 106 in addition to the electrode pads 109 provided at the pad area 107. A power supply voltage is supplied to the voltage pump circuit 103 inside the first peripheral circuit area 102 from the power supply pad 1091B. Accordingly, the voltage pump circuit 103 is disposed at the second peripheral circuit area 106 side (the pad area 107 side) inside the first peripheral circuit area 102.

There is a possibility in which a conventional memory device such as the NAND-type flash memory cannot satisfy the standard of the memory card such as, for example, the micro SD™ card as for its device size (chip size), particularly as for the length Y in the short-edge direction resulting from the high capacity as stated above. It is because the more memory chips can be housed inside a Si wafer if a shape of the memory array area is closer to square in addition to a restriction resulting from an exposure area of an exposure device, when plural memory array areas are applied. In this case, a structure is taken in which a major part of the peripheral circuits is disposed at the same area and in the same direction as pad columns. Accordingly, the conventional memory device has a circuit disposition in which there is limit in a reduction of the length Y in the short-edge direction compared to a length X in the long-edge direction.

In the memory device 12 of the embodiment, the first peripheral circuit area 102 is disposed between the plural cell array areas 101A, 101B, and the voltage pump circuit 103 and the peripheral circuits 104 including the word line control circuit, and so on are provided at the first peripheral circuit area 102 to address to the above-stated problems. Further, the pad area 107 having the electrode pads 109 and the circuit area 108 having the minimum peripheral circuits 110 are provided at the second peripheral circuit area 106 disposed at one short-edge 101b side of the plural cell array areas 101A, 101B. According to the circuit disposition as stated above, it is possible to shorten the length Y of the short-edge 12b of the memory device (memory chip) 12.

Accordingly, it is possible to make the size of the memory device 12, in particular, the length Y of the short-edge 12b satisfy the size standard of a small-sized memory card of which width in the short-edge direction is narrow such as the micro SD™ card, in addition to securing the cell array area 101 necessary for enabling the high capacity of the memory device 12. The first peripheral circuit area 102 has a shape in which a length XA of a short-edge is longer than a length YA of a short-edge of the second peripheral circuit area 106 (XA>YA) to satisfy a condition as stated above. It is thereby possible to decrease the length Y of the short-edge 12b of the memory device 12.

Further, the electrode pads 109 (13) are one-sidedly arranged at one short-edge 12b side because the pad area 107 is one-sided toward one short-edge 12b side of the memory device 12 inside the second peripheral circuit area 106. It is possible to finely perform the wire bonding with the connection pads 10 (the connection pads 10 inside the first pad area 11A) disposed along the long-edge 5A of the wiring board 2 except the cut-out portion 6, by applying an arrangement shape of the electrode pads 109 (13) as stated above. This contributes to a large-sizing (enlargement of the size) of the memory device 12 which can be mounted on the wiring board 2 as stated above.

The memory card 1 of the embodiment includes a plurality of memory devices 12 having the above-stated constitutions (circuit dispositions). The memory devices 12 are stacked on the second surface 2b of the wiring board 2, to constitute a memory device group 16. In this embodiment, the memory device group 16 is constituted by four pieces of memory devices 12. The four pieces of memory devices 12 are sequentially stacked via adhesive layers 17.

Among the four pieces of memory devices 12 constituting the memory device group 16, a first memory device 12A at a first step is adhered on the chip mounting area 9 of the wiring board 2 via a first adhesive layer 17A while turning an electrode forming surface (circuit forming surface) having the electrode pads 13 toward upward. A die attach film (adhesive film) of which major constituents are a general polyimide resin, epoxy resin, acrylic resin, and so on is used as the first adhesive layer 17A.

A second memory device 12B positioning at a second step is adhered on the first memory device 12A via a second adhesive layer 17B while turning the electrode pads 13 toward upward. Similarly, a third memory device 12C positioning at a third step is adhered on the second memory device 12B via a third adhesive layer 17C while turning the electrode pads 13 toward upward. A fourth memory device 12D positioning at a fourth step is adhered on the third memory device 12C via a fourth adhesive layer 17D while turning the electrode pads 13 toward upward.

The first to fourth memory devices 12A to 12D have identical shapes in rectangular states, and they are stacked while respectively aligning outer edges thereof at the same position. Namely, the first to fourth memory devices 12A to 12D are stacked while respectively aligning the long-edges and short-edges thereof so that an occupied area of the memory devices 12A to 12D (a chip occupied area after stacking) relative to the wiring board 2 becomes the minimum (an area corresponding to one piece of memory device 12). As a result, it is possible to mount the large-sized memory devices 12 on the wiring board 2 of which size is defined.

Respective electrode pads 13 of the first to fourth memory devices 12A to 12D are electrically connected to the connection pads 10 disposed at the first pad area 11A via the first metal wires 14. The electrode pads 15 are also electrically connected to the connection pads 10 via the first metal wires 14. General Au wires or Cu wires are used as the metal wires 14. It is preferable to perform the wire bonding of the metal wire 14 by applying a reverse bonding capable of reducing a loop height thereof. A metal bump is formed in advance on the electrode pad 13. One end of the metal wire 14 is ball connected to the connection pad 10, and the other end is connected to the metal bump formed on the electrode pad 13.

There is a possibility that a defect such as a short-circuit may occur, because the first metal wires 14 connected to the first to third memory devices 12A to 12C are intervened by the memory device 12 positioning at an upper step side. An end portion (chip side end portion) of the first metal wire 14 connected to the electrode pad 13 of the first memory device 12A positioning at a lower step side is embedded in the adhesive layer 17B of the second memory device 12B positioning at the upper step side. Similarly, the end portions of the first metal wires 14 connected to the electrode pads 13 of the second and third memory devices 12B, 12C are embedded in the adhesive layer 17C of the third memory device 12C, or in the adhesive layer 17D of the fourth memory device 12D respectively positioning at the upper step side.

As stated above, the end portions of the first metal wires 14 connected to the memory devices 12A, 12B, 12C positioning at the lower step sides among the memory device group 16 except the fourth memory device 12D at the uppermost step are embedded in the adhesive layers 17B, 17C, 17D of the memory devices 12B, 12C, 12D positioning at the upper step sides. It is thereby prevented that the first metal wires 14 are brought into contact with the memory devices 12B, 12C, 12D. The first metal wires 14 are set apart from the memory devices 12B, 12C, 12D based on thicknesses of the second to fourth adhesive layers 17B to 17D. As stated above, the second to fourth adhesive layers 17B to 17D also have a function as spacer layers.

Each of the second to fourth adhesive layers 17B to 17D is composed of an insulating resin having an adhesive function with the memory device 12 and a function taking the first metal wires 14 inside thereof by getting soft at an adhesion temperature. As the insulating resin as stated above, for example, a thermoplastic resin such as an acrylic resin, or a thermosetting resin such as an epoxy resin can be cited. It is preferable that the thicknesses of the adhesive layers 17B to 17D are within a range of 30 μm to 100 μm, and it is further preferable to be set within a range of 40 μm to 60 μm. When the thicknesses of the adhesive layers 17B to 17D are less than 30 μm, there is a possibility in which the contact of the metal wire 14 with the memory device 12 cannot be suppressed.

When the thicknesses of the adhesive layers 17B to 17D exceed 100 μm, a stack thickness of the memory devices 12 becomes too thick.

The thicknesses of the memory devices 12A to 12D are not necessarily limited. The thickness of the first memory device 12A at the lowermost step is preferable to be thicker than the thicknesses of the other memory devices 12B, 12C, 12D. The thickness of the first memory device 12A is, for example, within a range of 50 μm to 150 μm. When the number of memory devices 12 constituting the memory device group 16 is four pieces or more, the thicknesses of the memory devices 12B to 12D other than the first memory device 12A are within a range of, for example, 10 μm to 50 μm. When the number of memory devices 12 constituting the memory device group 16 is three pieces or less, it is out of the above limitation.

Figure 5:
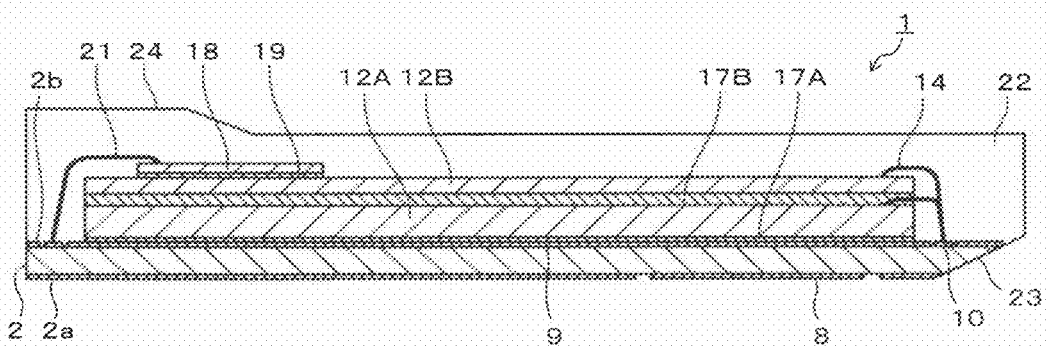
FIG. 5 is a sectional view showing a modification example of the semiconductor memory card shown in FIG. 1.
Figure 6:
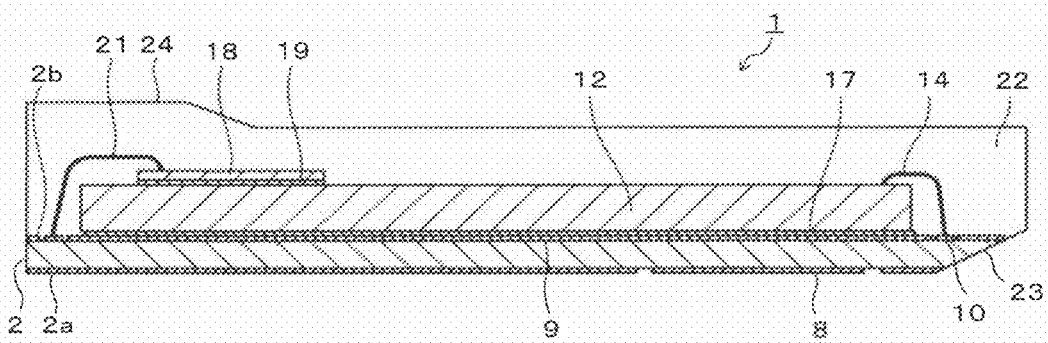
FIG. 6 is a sectional view showing another modification example of the semiconductor memory card shown in FIG. 1.

The memory card 1 in which the memory device group 16 is constituted by four pieces of memory devices 12 is shown in FIG. 2 and FIG. 3, but the number of memory devices 12 is not limited to the above. The memory device group 16 may be constituted by two pieces of memory devices 12A, 12B, as shown in FIG. 5. Further, the memory device group 16 can be constituted by five pieces or more of memory devices 12. The memory card 1 may have a structure in which one piece of memory device 12 is mounted on the wiring board 2 as shown in FIG. 6. The number of memory devices 12 mounted on the wiring board 2 may be either one piece or plural pieces.

A controller device 18 is disposed on the memory device group 16, and is adhered on the fourth memory device 12D via an adhesive layer 19. The controller device 18 selects a device to perform writing or reading of data from the plural memory devices 12, and performs the writing of data to the selected memory device 12 and the reading of data stored in the selected memory device 12. The controller device 18 has an L-type pad structure, and has electrode pads 20A arranged along a first edge (short-edge) 18a positioning in a vicinity of the long-edge 5A of the wiring board 2 and electrode pads 20B arranged along a second edge (long-edge) 18b positioning in a vicinity of the short-edge 4B of the wiring board 2.

The electrode pads 20A, 20B of the controller device 18 are electrically connected to the connection pads 10 via second metal wires 21. Namely, the electrode pads 20A arranged along the short-edge 18a of the controller device 18 are electrically connected to the connection pads 10 disposed at the first pad area 11A via the metal wires 21. The electrode pads 20B arranged along the long-edge 18b of the controller device 18 are electrically connected to the connection pads 10 disposed at the second pad area 11B via the metal wires 21.

Figure 7:
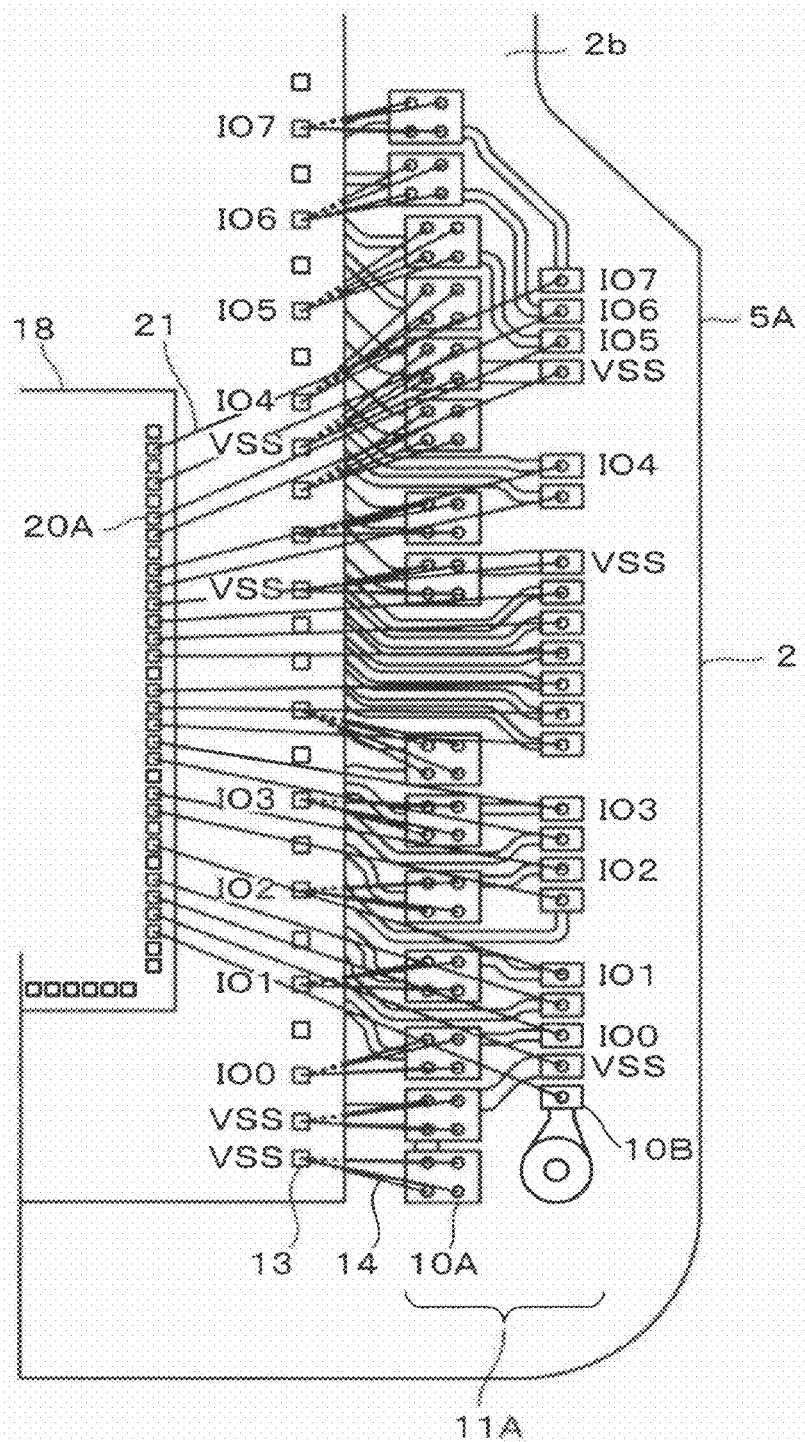
FIG. 7 is a view showing a connection state of the memory device and a controller device, with a wiring board in the semiconductor memory card shown in FIG. 1.

As shown in FIG. 7, connection pads 10A for the memory device 12 and connection pads 10B for the controller device 18 are disposed at the first pad area 11A. The connection pads 10A for the memory device 12 are disposed at a side close to the chip mounting area 9, and the connection pads 10B for the controller device 18 are disposed at outer side than the connection pads 10A. It is necessary to wire between the connection pads 10A for the memory device 12 to route around the wires from the connection pads 10B for the controller device 18 positioning at outside. The routing around of wires from the connection pads 10B becomes easy by aligning the dispositions of the electrode pads 13 of the memory device 12 and the electrode pads 20A of the controller device 18.

In the pad disposition shown in FIG. 7, a part of a terminal for data signal (IO4 terminal) of the memory device 12 is different from a terminal arrangement of the controller device 18, but the dispositions of the other electrode pads 20A of the controller device 18 are aligned with the electrode pads 13 of the memory device 12. Not only the routing around of wires from the connection pads 10B becomes easy, but also the wirings are shortened and electric properties can be improved, by applying the pad disposition as stated above. It is preferable to align at least a part of a pad arrangement order of the controller device 18 with a pad arrangement order of the memory device 12, and in particular, it is desirable to align all of the pad arrangement orders.

A sealing resin layer 22 composed of, for example, an epoxy resin is formed by molding on the second surface 2b of the wiring board 2 on which the semiconductor chips such as the memory devices 12 and the controller device 18 are mounted. The memory devices 12 and the controller device 18 are integrally sealed by the sealing resin layer 22 together with the metal wires 14, 21, and so on. An inclined portion 23 indicating a frontward of the memory card is provided at a tip portion of the sealing resin layer 22. A handle portion 24 mounding a part of the sealing resin is provided at a rear portion of the sealing resin layer 22. The memory card 1 is constituted by the above-stated components. Incidentally, the sealing resin layer 22 is not shown in FIG. 1.

The memory card 1 constitutes a semiconductor memory card (for example, a micro SD™ card) by itself without using a storage case such as a base card. Accordingly, the sealing resin layer 22 and soon are under a state directly exposing toward outside. Namely, the memory card 1 is a case-less semiconductor memory card exposing the sealing resin layer 22 and soon toward outside. The above-stated cut-out portion 6, the constricted portion 7, and the inclined portion 23 indicating the directions of the front-and-rear, obverse-and-reverse and so on of the memory card 1 are provided at the memory card 1 in itself (specifically, at the wiring board 2 and the sealing resin layer 22).

It is enabled to mount the memory device 12 as large as possible relative to the wiring board 2 of which shape and size are defined according to the memory card 1 of the embodiment. Accordingly, it is possible to make the memory card 1 high capacity based on the shape (size) of the memory device 12. As for the number of memory devices 12 to be mounted, it is enabled to stack and mount the large-sized memory devices 12 in multistage by devising a connection structure and so on of the metal wires 14. According to the embodiment, it is possible to provide the high capacity memory card 1 based on the size and the stacked structure of the memory devices 12.

A thickness of the memory card 1 is the thickness in which the thickness of the wiring board 2 and the thickness of the sealing resin layer 22 on the controller device 18 (resin thickness on a chip) are added to the stack thickness of the memory devices 12 and the controller device 18. When the thickness of the wiring board 2 is 125 μm, the thickness of the memory device 12A at the first step is 60 μm, the thickness of the adhesive layer 17A is 20 μm, the thicknesses of the second to fourth memory devices 12B to 12D are 40 μm, the thicknesses of these adhesive layers 17B to 17D are 50 μm, the thickness of the controller device 18 is 55 μm, the thickness of the adhesive layer 19 is 5 μm, the resin thickness on the chip of the sealing resin layer 22 is 160 μm (the thickness of the sealing resin layer 22 is 575 μm), a total thickness of the above becomes 700 μm which is within a defined thickness of the micro SD™ card.

It is possible to provide the 8 GB micro SD™ card (memory card 1) by using four pieces of memory devices 12 enabling the storage capacity of 2 GB owing to the improvement in the recording density and the increase in the chip size and so on. The number of memory devices 12 to be mounted may be two pieces (FIG. 5) or one piece (FIG. 6). When the number of memory devices 12 to be mounted is two pieces, the 4 GB micro SD™ card (memory card 1) is provided, and when the number of memory devices 12 to be mounted is one piece, a 2 GB micro SD™ card (memory card 1) is provided.

The memory card 1 in the above-stated embodiment is effective for a case-less semiconductor memory card constituted by the memory card 1 by itself, but a semiconductor memory card using a case such as a base card is not necessarily excluded. Further, the structure of the semiconductor memory card of the embodiment can be applied for a semiconductor memory device other than the memory card depending on circumstances. A device structure of the embodiment can be applied to semiconductor memory devices having a BGA package structure and an LGA package structure. A basic structure of the semiconductor package is similar to the memory card except that an external connection terminal (ball terminal) constituted by a solder ball and so on is provided on a wiring board.

Note that the semiconductor memory card of the present invention is not limited to the above-stated embodiments, but it can be applied to various semiconductor memory cards mounting one or plural pieces of memory device(s) on a wiring board having a cut-out portion. A concrete structure of the semiconductor memory card of the present invention can be modified variously as long as a basic constitution of the present invention is satisfied. Further, embodiments of the present invention can be expanded/modified within a range not departing from the spirit of the invention, and such expanded/modified embodiments are also included in the technical scope of the present invention.

What is claimed is:

1. A semiconductor memory card, comprising:
   a wiring board having an outer shape in rectangular state including a cut-out portion provided at a first long-edge, a first surface including an external connection terminal, and a second surface including connection pads, wherein the cut-out portion has a length parallel to the first long-edge of the wiring board and a width parallel to a first short-edge of the wiring board, the second surface of the wiring board includes a first pad area having a length corresponding to a residual portion except the cut-out portion of the first long-edge and a width corresponding to the width of the cut-out portion, and at least part of the connection pads is disposed in the first pad area along the residual portion of the first long-edge;
   a memory device, mounted on the second surface of the wiring board, including electrode pads one-sidedly arranged to correspond to the connection pads disposed in the first pad area, along a long-edge positioning in a vicinity of the first long-edge of the wiring board;
   a controller device, stacked on the memory device, including electrode pads arranged along at least one outer edge;
   first metal wires electrically connecting the electrode pads of the memory device and the connection pads disposed in the first pad area of the wiring board;
   second metal wires electrically connecting the electrode pads of the controller device and the connection pads of the wiring board; and
   a sealing resin layer formed on the second surface of the wiring board to seal the memory device and the controller device together with the first and the second metal wires,
   wherein the first pad area is provided along the residual portion except the cut-out portion of the first long-edge.

2. The semiconductor memory card according to claim 1, wherein the cut-out portion is provided by cutting-out a part of the first long-edge including a corner portion between the first long-edge and the first short-edge of the wiring board and a part of the first short-edge including the corner portion, along the first long-edge.

3. The semiconductor memory card according to claim 2, wherein the memory device is disposed at a rectangular area having a width based on a portion of the first short-edge of the wiring board except the cut-out portion and a length based on a second long-edge facing the first long-edge.

4. The semiconductor memory card according to claim 2, wherein the second surface of the wiring board further includes a second pad area provided along a second short-edge facing the first short-edge.

5. The semiconductor memory card according to claim 4, wherein the electrode pads of the controller device are arranged along a first edge positioning in a vicinity of the first long-edge of the wiring board and a second edge positioning in a vicinity of the second short-edge of the wiring board.

6. The semiconductor memory card according to claim 5, wherein the electrode pads arranged along the first edge of the controller device are electrically connected to the connection pads disposed at the first pad area of the wiring board via the second metal wires, and the electrode pads arranged along the second edge of the controller device are electrically connected to the connection pads disposed at the second pad area of the wiring board via the second metal wires.

7. The semiconductor memory card according to claim 1, wherein the memory device includes:
a plurality of cell array areas having rectangular area shapes, and disposed in parallel while aligning directions of long-edges of the area shapes;
a first peripheral circuit area, disposed between the plurality of cell array areas, including a voltage pump circuit; and
a second peripheral circuit area disposed at one short-edge side of the plurality of cell array areas, and
wherein the electrode pads are one-sidedly arranged along a direction of the short-edges of the plurality of cell array areas, inside the second peripheral circuit area.

8. A semiconductor memory card, comprising:
a wiring board having an outer shape in rectangular state including a cut-out portion provided at a first long-edge, a first surface including an external connection terminal, and a second surface including connection pads, wherein the cut-out portion has a length parallel to the first long-edge of the wiring board and a width parallel to a first short-edge of the wiring board, the second surface of the wiring board includes a first pad area having a length corresponding to a residual portion except the cut-out portion of the first long-edge and a width corresponding to the width of the cut-out portion, and at least part of the connection pads is disposed in the first pad area along the residual portion of the first long-edge;
a memory device group having a plurality of memory devices stacked on the second surface of the wiring board, the memory devices including electrode pads one-sidedly arranged to correspond to the connection pads disposed in the first pad area, along a long-edge positioning in a vicinity of the first long-edge of the wiring board;
a controller device, stacked on the memory device group, including electrode pads arranged along at least one outer edge;
first metal wires electrically connecting the electrode pads of the memory devices and the connection pads disposed in the first pad area of the wiring board;
second metal wires electrically connecting the electrode pads of the controller device and the connection pads of the wiring board; and
a sealing resin layer formed on the second surface of the wiring board to seal the memory device group and the controller device together with the first and the second metal wires.

9. The semiconductor memory card according to claim 8, wherein the cut-out portion is provided by cutting-out a part of the first long-edge including a corner portion between the first long-edge and the first short-edge of the wiring board and a part of the first short-edge including the corner portion, along the first long-edge.

10. The semiconductor memory card according to claim 9, wherein the memory device is disposed at a rectangular area having a width based on a portion except the cut-out portion of the first short-edge of the wiring board and a length based on a second long-edge facing the first long-edge.

11. The semiconductor memory card according to claim 8, wherein the memory devices have identical shapes in rectangular states, and are stacked via adhesive layers while aligning outer edges thereof.

12. The semiconductor memory card according to claim 11, wherein an end portion of the first metal wire connected to the electrode pad of the memory device positioning at a lower step side among the memory devices is embedded inside the adhesive layer of the memory device positioning at an upper step side.

13. The semiconductor memory card according to claim 9, wherein the second surface of the wiring board further includes a second pad area provided along a second short-edge facing the first short-edge.

14. The semiconductor memory card according to claim 13, wherein the electrode pads of the controller device are arranged along a first edge positioning in a vicinity of the first long-edge of the wiring board and a second edge positioning in a vicinity of the second short-edge of the wiring board.

15. The semiconductor memory card according to claim 14, wherein the electrode pads arranged along the first edge of the controller device are electrically connected to the connection pads disposed at the first pad area of the wiring board via the second metal wires, and the electrode pads arranged along the second edge of the controller device are electrically connected to the connection pads disposed at the second pad area of the wiring board via the second metal wires.

16. The semiconductor memory card according to claim 8, wherein the memory device includes:
a plurality of cell array areas having rectangular area shapes, and disposed in parallel while aligning directions of long-edges of the area shapes;
a first peripheral circuit area, disposed between the plurality of cell array areas, including a voltage pump circuit; and
a second peripheral circuit area disposed at one short-edge side of the plurality of cell array areas, and
wherein the electrode pads are one-sidedly arranged along a direction of the short-edges of the plurality of cell array areas, inside the second peripheral circuit area.

* * * * *